United States Patent
Goyal et al.

(10) Patent No.: US 9,246,310 B2
(45) Date of Patent: Jan. 26, 2016

(54) WAVELENGTH BEAM COMBINING OF QUANTUM CASCADE LASER ARRAYS

(75) Inventors: Anish Goyal, Cambridge, MA (US); Benjamin G. Lee, Toronto (CA); Christian Pfluegl, Medford, MA (US); Laurent Diehl, Cambridge, MA (US); Mikhail Belkin, Austin, TX (US); Antonio Sanchez-Rubio, Lexington, MA (US); Federico Capasso, Cambridge, MA (US)

(73) Assignees: President and Fellows of Harvard College, Cambridge, MA (US); Massachusetts Institute of Technology, Cambridge, MA (US)

( * ) Notice: Subject to any disclaimer, the term of this patent is extended or adjusted under 35 U.S.C. 154(b) by 495 days.

(21) Appl. No.: 13/197,058

(22) Filed: Aug. 3, 2011

(65) Prior Publication Data
US 2012/0033697 A1   Feb. 9, 2012

Related U.S. Application Data

(60) Provisional application No. 61/370,286, filed on Aug. 3, 2010.

(51) Int. Cl.
| | |
|---|---|
| H01S 5/34 | (2006.01) |
| B82Y 20/00 | (2011.01) |
| H01S 5/00 | (2006.01) |
| H01S 5/024 | (2006.01) |
| H01S 5/026 | (2006.01) |
| H01S 5/028 | (2006.01) |
| H01S 5/0683 | (2006.01) |
| H01S 5/0687 | (2006.01) |
| H01S 5/12 | (2006.01) |

(Continued)

(52) U.S. Cl.
CPC ............... *H01S 5/3402* (2013.01); *B82Y 20/00* (2013.01); *H01S 5/0014* (2013.01); *H01S 5/0071* (2013.01); *H01S 5/0261* (2013.01); *H01S 5/0287* (2013.01); *H01S 5/02415* (2013.01); *H01S 5/0687* (2013.01); *H01S 5/06837* (2013.01); *H01S 5/12* (2013.01); *H01S 5/141* (2013.01); *H01S 5/4087* (2013.01)

(58) Field of Classification Search
CPC . H01S 5/0071; H01S 5/02415; H01S 5/0287; H01S 5/06837; H01S 5/0687; H01S 5/12; H01S 5/141; H01S 5/3401; H01S 5/3402; H01S 5/4087
USPC .......................................................... 372/102
See application file for complete search history.

(56) References Cited

U.S. PATENT DOCUMENTS

| | | | | |
|---|---|---|---|---|
| 6,327,292 | B1 * | 12/2001 | Sanchez-Rubio et al. | 372/92 |
| 7,466,734 | B1 * | 12/2008 | Day et al. | 372/39 |
| 7,751,458 | B2 * | 7/2010 | Regaard et al. | 372/50.12 |

(Continued)

OTHER PUBLICATIONS

Lee, Benjamin G. et al., "Beam Combining of Quantum Cascade Laser Arrays", Optics Express, vol. 17, No. 18, Aug. 31, 2009.

(Continued)

*Primary Examiner* — Xinning Niu
(74) *Attorney, Agent, or Firm* — Wolf, Greenfield & Sacks, P.C.

(57) ABSTRACT

A laser source based on a quantum cascade laser array (QCL), wherein the outputs of at least two elements in the array are collimated and overlapped in the far field using an external diffraction grating and a transform lens.

19 Claims, 22 Drawing Sheets

(51) Int. Cl.
*H01S 5/14* (2006.01)
*H01S 5/40* (2006.01)

(56) References Cited

U.S. PATENT DOCUMENTS

| | | | |
|---|---|---|---|
| 7,826,509 B2 | 11/2010 | Belkin et al. | |
| 2005/0129072 A1* | 6/2005 | Tayebati et al. | 372/9 |
| 2006/0092994 A1* | 5/2006 | Frankel et al. | 372/18 |
| 2008/0144677 A1* | 6/2008 | Belkin et al. | 372/20 |
| 2010/0110556 A1* | 5/2010 | Chann et al. | 359/619 |

OTHER PUBLICATIONS

Lee, Benjamin G. et al., "Wavelength Beam Combining of Quantum Cascade Laser Array for Remote Sensing", downloaded from SPIE Digital Library on Oct. 7, 2009.

Lee et al., "Widely Tunable Single-Mode Quantum Cascade Laser Source for Mid-Infrared Spectroscopy", Applied Physics Letters 91, 231101 (2007).

\* cited by examiner

WAVELENGTH BEAM COMBINING OF QUANTUM CASCADE LASER ARRAYS

CROSS-REFERENCE TO RELATED APPLICATIONS

This application claims priority under 35 U.S.C. §119(e) to U.S. Provisional Application No. 61/370,286 titled "WAVELENGTH BEAM COMBINING OF QUANTUM CASCADE LASER ARRAYS" filed Aug. 3, 2010, which is herein incorporated by reference in its entirety.

FEDERALLY SPONSORED RESEARCH

This invention was made with government support under Grant No FA8721-05-C-0002 awarded by the United States Air Force and grant number HR00-04-1-0032 awarded by the DARPA Optofluidics Center. The U.S. government has certain rights in this invention.

BACKGROUND

1. Field of Invention

The present invention relates to semiconductor lasers and, more particularly, to wavelength beam combining applied to arrays of quantum cascade lasers.

2. Discussion of Related Art

Quantum cascade lasers (QCLs) are electrically driven semiconductor lasers. They are compact and can be efficient and reliable. QCLs emit or lase at room temperature in the infrared region at wavelengths spanning about 3 micrometers (μm) to 24 μm. This wavelength range overlaps many molecular absorption lines of interest. Individual QCLs can achieve watt-level output power in continuous-wave operation at room temperature and can be designed to have broadband gain such that the lasing wavelength can be tuned over a broad spectral range of approximately 300 $cm^{-1}$.

Conventional diode lasers generate photons through an electronic transition across the bandgap of a semiconductor in which the diode laser is fabricated, as shown in FIG. 1. Accordingly, the emission wavelength is determined by the bandgap of the semiconductor material. In contrast, QCLs operate based on resonant tunneling and optical transitions between electronic levels within the conduction band of the semiconductor. The energy levels, and hence the lasing wavelength, can be controlled by modulating the electronic potential applied to the semiconductor. FIG. 2 illustrates an energy-band diagram of a generic QCL under bias. The applied electric field drives the electrons from the right toward the left, as indicated by arrows 210. The gain region includes a series of cascades 220 formed by alternating layers of two different semiconductor materials, each cascade including an injector region 230 and an active region 240. Electrons transit an injector region 230 and are injected into the upper lasing level within the active region 240. The electron undergoes a radiative transition to the lower lasing level, emitting a photon, and is then scattered into the ground state where it is coupled into the next injector region 230. Ideally, an electron can generate as many photons as there are cascades 220 in the gain region of the QCL.

Continuously-tunable, single-mode emission is required for many spectroscopic applications. To achieve single-mode emission, QCL material is generally processed into distributed feedback (DFB) lasers or integrated with a frequency-selective external cavity. External cavity QCLs are widely tunable (e.g., 10-20% of the laser emission frequency), but are cumbersome and complex to build as they require high quality anti-reflection coatings and well-aligned external optical components including a grating for tuning. Furthermore, wavelength tuning is relatively slow because it depends upon mechanical movement of the optical components. DFB QCLs include a grating defined in the waveguide for wavelength control. An example of a distributed feedback quantum cascade laser element is illustrated in FIG. 3. The width of the emitting aperture of the DFB QCL element is defined by etching into the semiconductor material. Current is generated through the active regions of the DFB QCL via a metal contact 310 on top of the ridge 320 and a substrate contact (not shown), which in turn generates optical gain in the DFB QCL. The optical power output 330 is emitted normal to the cleaved facet. In the illustrated example, the grating 340 is etched into the top layer of the semiconductor. The lasing wavelength is determined by the period of the grating, and wavelength tuning is achieved by changing the temperature of the laser. DFB QCLs are compact; however, a single DFB QCL has limited tunability, typically only about 5-10 $cm^{-1}$, which is much smaller than the available gain bandwidth which is generally greater than 100 $cm^{-1}$.

Examples of a broadly tunable single-mode laser source based on an array of DFB QCLs driven by a microelectronic controller are described in U.S. patent application Ser. No. 11/611,819 entitled "CONTINUOUSLY TUNABLE SINGLE-MODE QUANTUM CASCADE LASER SOURCES AND SENSORS" patented on Nov. 2, 2010 under U.S. Pat. No. 7,826,509, and in "Widely tunable single-mode quantum cascade laser source for mid-infrared spectroscopy," Lee et. al, Applied Physics Letters 91, 231101 (2007), both of which are incorporated herein by reference in their entireties. The laser source includes an array of DFB QCLs with closely spaced emission wavelengths spanning the gain bandwidth of the QCL material, fabricated monolithically on the same chip and driven individually by a microelectronic controller. Each DFB QCL in the array has a DFB grating designed to target a slightly different emission wavelength, and the difference in the target emission wavelengths between adjacent (in frequency space) DFB QCLs in the array is smaller than the tuning range available with temperature tuning of the DFB QCLs. Therefore, by switching between the DFB lasers in the array and using temperature tuning of the individual lasers in the array, continuous spectral coverage can be obtained within the gain bandwidth of the QCL material.

SUMMARY OF INVENTION

Aspects and embodiments are directed to methods and apparatus that apply wavelength beam combining to spatially overlap the beams from a multi-wavelength array of quantum cascade lasers (QCLs). As discussed in detail below, the output of an array of single mode distributed feedback (DFB) QCLs may be combined using an external grating and a transform lens. The multi-wavelength source may be used for remote sensing of chemicals/compounds which have absorption features in the mid- to long-range infrared, as discussed further below. Applications of various embodiments include target or scene illumination, countermeasures, and chemical and biological spectroscopic applications such as, for example, remote spectroscopic sensing, high resolution spectroscopy, pollution monitoring, breath analysis, industrial process control, and remote detection of toxic chemicals and/or explosives.

According to one embodiment, a laser source comprises a quantum cascade laser (QCL) array including a plurality of QCL elements each configured to emit a laser beam, a dispersive element, and an optical element positioned between the QCL array and the dispersive element and configured to direct at least two laser beams (or at least substantial parts thereof) from the QCL array onto the dispersive element.

The optical element may be a lens or parabolic mirror, for example. In one example, the optical element is an optical element having a focal plane. In one example, the optical element is configured to direct the laser beams from the QCL array onto the dispersive element at different angles. In another example, an emission wavelength of the at least two laser beams and an angle at which the at least two laser beams are incident upon the dispersive element are configured to match the angular dispersion of the dispersive element and to combine the at least two laser beams into substantially a single output beam. The dispersive element may be a diffraction grating or a prism, for example. At least one QCL element of the QCL array may be a Fabry-Perot QCL.

In one embodiment, at least one QCL element of the QCL array is a distributed-feedback (DFB) QCL. At least one QCL element of the QCL array may include a monolithically integrated QCL amplifier section. In one example, a combination of spatial spacing and emission wavelength spacing between each of the plurality of QCL elements of the QCL array is selected to compensate for nonlinearity of the angular dispersion of the dispersive element to substantially provide a combined output beam from the laser source, the combined output beam including the laser beams from the plurality of QCL elements. In another example, a spatial spacing between the plurality of QCL elements of the QCL array is selected to compensate for pointing error due to a mismatch between an emission wavelength of the QCL elements in the QCL array and any nonlinearity of the dispersive element. In another example, a wavelength spacing between the plurality of QCL elements of the QCL array is selected to compensate for pointing error due to a mismatch between a position of the plurality of QCL elements in the array and any nonlinearity of the dispersive element. The laser source may further comprise a heat sink coupled to the QCL array, and a controller configured to alter at least one of a temperature of the heat sink and a temperature of least one of the DFB QCLs to tune an emission wavelength of the at least one DFB QCL to correct pointing error of the laser beam emitted by the at least one DFB QCL. In another example, the laser source further comprises a heat sink coupled to the QCL array, and a controller configured to alter at least one of a temperature of the heat sink and a temperature of least one of the DFB QCLs to tune an emission wavelength of the at least one DFB QCL to control a pointing direction of the laser beam emitted by the at least one DFB QCL. At least one of the DFB QCLs may include a DFB grating of at least a second order.

In another embodiment of the laser source, at least one QCL element of the QCL array includes an anti-reflection coating covering an output facet of the at least one QCL element. At least one QCL element of the QCL array may be operated in a pulsed mode. In another example, at least one QCL element of the QCL array is operated in a continuous wave mode. In one example, at least two QCL elements of the QCL array are operated simultaneously. In another example, at least two QCL elements of the QCL array are turned on sequentially. The laser source may further comprise a lens array positioned between the QCL array and the optical element. In another example, the laser source further comprises a half-wave plate positioned between the QCL array and the dispersive element, the half-wave plate being configured to rotate a polarization of the laser beams. In another example, the dispersive element is a first dispersive element, and the laser source further comprises a second dispersive element optically coupled to the first dispersive element and configured to improve overlap in the far field of the laser beams from the laser source.

Other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

Figure 1:
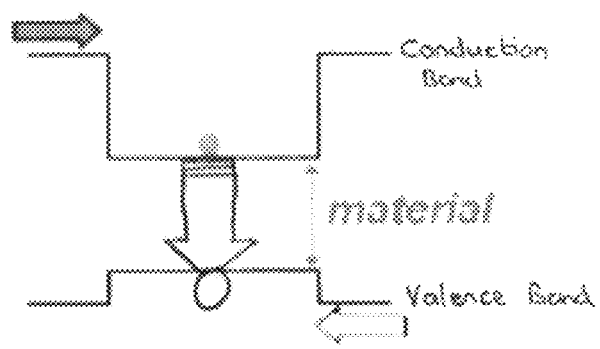
FIG. 1 is a diagram illustrating operation of a conventional diode laser.
Figure 2:
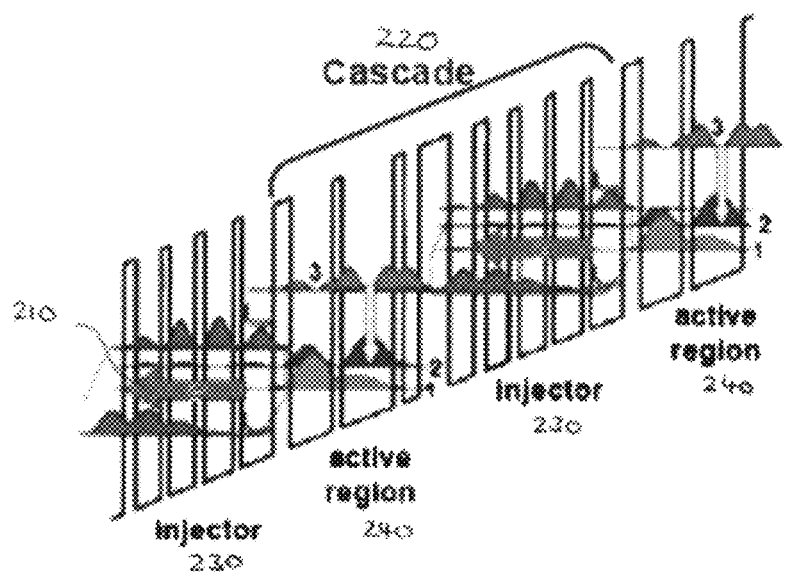
FIG. 2 is an energy-band diagram of a generic quantum cascade laser under bias.
Figure 3:
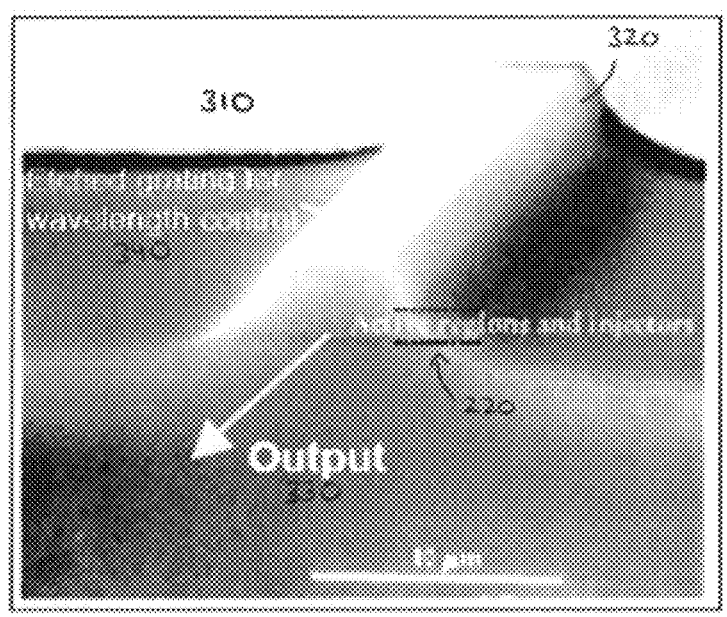
FIG. 3 is a photograph of the emitting facet of an example of a distributed feedback quantum cascade laser element.

Arrays of distributed feedback (DFB) quantum cascade lasers (QCLs) can be implemented as single-mode laser sources covering a wide range of mid-infrared frequencies. For various applications in which such QCL arrays be used it may be desirable to have the beams from the individual lasers in the array co-propagate so that the beams overlap in the far-field. For example, for remote-sensing applications, if the beams can be collimated and propagated a long distance where they all overlap, then a single detector may be used at the end of the beam path to measure the resulting signal. However, when using a lens having a focal length f to collimate the emissions from the lasers in the array, each laser will point at a different angle given by:

$$\Delta\theta = \tan^{-1}\left(\frac{\Delta x}{f}\right) \quad (1)$$

In equation (1), $\Delta\theta$ is measured with respect to the axis of the lens and $\Delta x$ is the transverse position of each laser in the array relative to the focal point of the lens. In this case, the laser beams will be spatially separated in the far-field.

Aspects and embodiments are directed to using wavelength beam combining (WBC) to spatially overlap the beams from an array of DFB QCL lasers in both the near-field and the far-field. The general principle of wavelength beam combining is to take spatially separated beams with distinct optical spectra and combine them using a wavelength-sensitive beam combiner. Examples of wavelength-sensitive beam combiners include prisms and diffraction gratings, which can deflect incident beams according to their wavelength so that the beams propagate in the same direction after the combiner. Wavelength beam combining can be considered the reverse of a grating spectrometer in which a single beam of white light, containing many wavelengths, is split into angularly resolved monochromatic beams.

Wavelength beam combining for diode laser arrays and fiber lasers has been demonstrated and is discussed in U.S. patent application Ser. No. 12/611,514 entitled "EXTERNAL-CAVITY ONE-DIMENSIONAL MULTI-WAVELENGTH BEAM COMBINING OF TWO-DIMENSIONAL LASER ELEMENTS" published on May 6, 2010 under U.S. Publication No. 2010-0110556, and in U.S. patent application Ser. No. 12/788,579 entitled "HIGH PEAK POWER OPTICAL AMPLIFIER" filed on May 27, 2010, both of which are incorporated herein by reference in their entireties. In one form of wavelength beam combining, the laser array elements are incorporated in an external cavity containing a diffraction grating and a transform lens. An output coupler in the cavity provides optical feedback to each of the laser elements to select their emission wavelengths and automatically causes all of the laser beams to propagate collinearly. This form of wavelength beam combining is termed "closed-loop." In another form of wavelength beam combining termed "open-loop," the laser array elements have their emission wavelengths selected independent of the grating that combines the beams. For example, a volume Bragg grating may be used for wavelength selection, and beam combining may be achieved through the use of a diffraction grating in combination with a transform lens, as discussed below, but without the need for an output coupler. In one embodiment, an open-loop wavelength beam combining method is used to combine the beams from an array of DFB QCLs. As discussed below, in one example, DFB gratings in the array itself are used to provide wavelength selection, and an external grating is used only to combine the output beams from the array and is not used to provide optical feedback into the elements of the array. This allows independent optimization of components and parameters of the system, for example, the output power of the laser elements in the array and the efficiency of the beam combining optics (particularly the grating efficiency).

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 4:
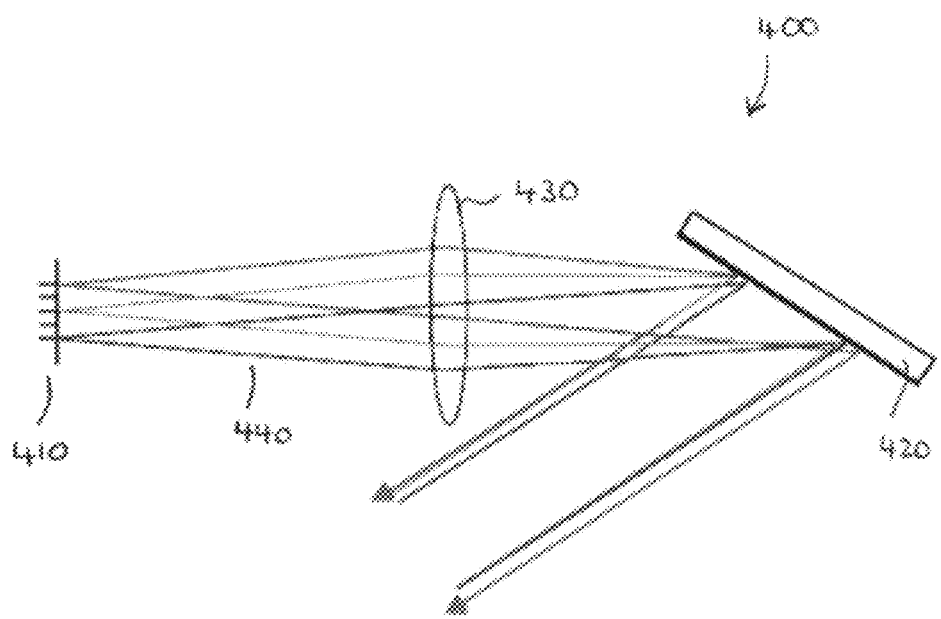
FIG. 4 is a schematic diagram of wavelength beam combining with an array of distributed feedback quantum cascade lasers, according to aspects of the invention.

Referring to FIG. 4 there is illustrated a schematic diagram of wavelength beam combining with an array of DFB QCLs according to one embodiment. The laser system 400 comprises an array 410 of DFB QCLs formed on a single chip, each laser element of the array configured to lase at a different frequency. In one embodiment, each laser element in the array is individually addressable such that its emission wavelength can be individually controlled. Beam combining is accomplished using a suitably placed grating 420 and transform lens 430 that overlap the beams 440 from the laser elements in both the near-field and the far-field. The grating 420 may be referred to as an external grating to distinguish it from the DFB gratings that are part of the DFB QCL array. In one example, the transform lens 430 is placed one focal length away from the front facet of the array 410. The transform lens 430 acts to transform the position of the position of each DFB QCL laser element in the array 410 into an angle of incidence on the grating 420. After the transform lens 430, the beams 440 from each laser in the array 410 will point in a different direction; however, by placing the diffraction grating 420, having an appropriate groove density and angular position, after the transform lens 430, all the laser beams can be made to point in substantially the same direction, resulting in the beams being overlapped in the far-field. By placing the grating 420 one focal length away from the transform lens 430, all the beams 440 are overlapped at the grating (defined herein as the near-field of the optical system 400).

Figure 5A:
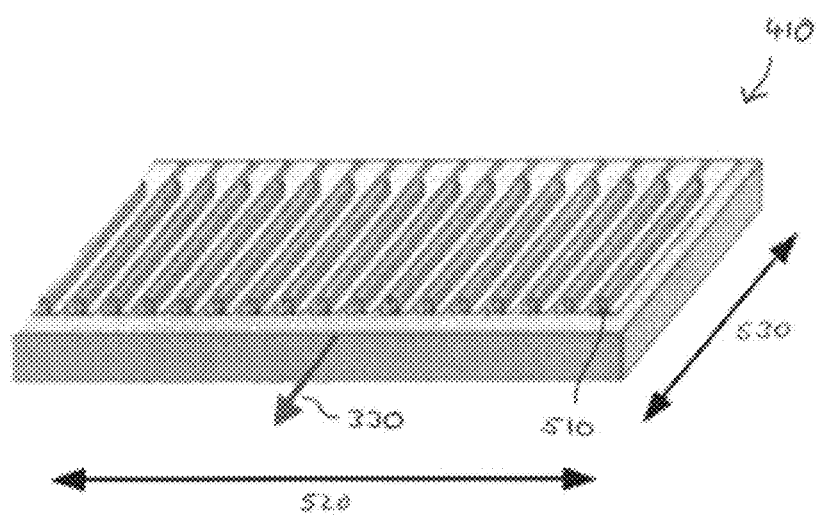
FIG. 5A is a schematic diagram of one example of an array of distributed feedback quantum cascade lasers.
Figure 5B:
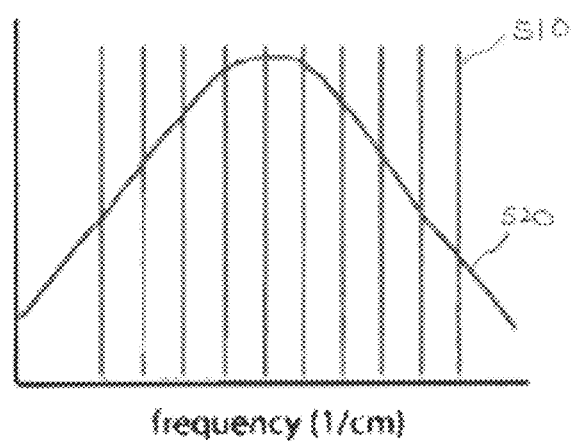
FIG. 5B is an example plot of emission frequency for the array of FIG. 5A.
Figure 6A:
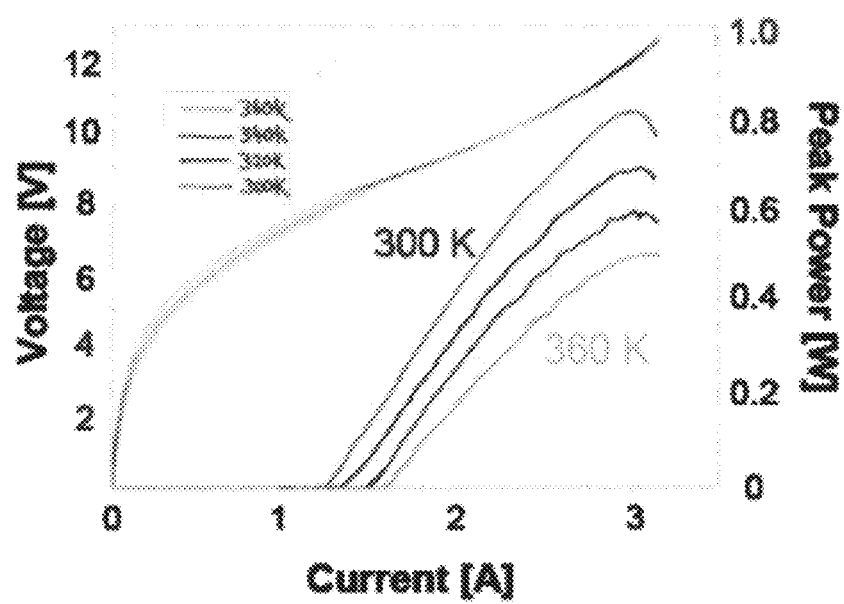
FIG. 6A is a graph of light-current-voltage characteristics for a Fabry-Perot laser fabricated from a GaInAs/AlInAs QCL material.
Figure 6B:
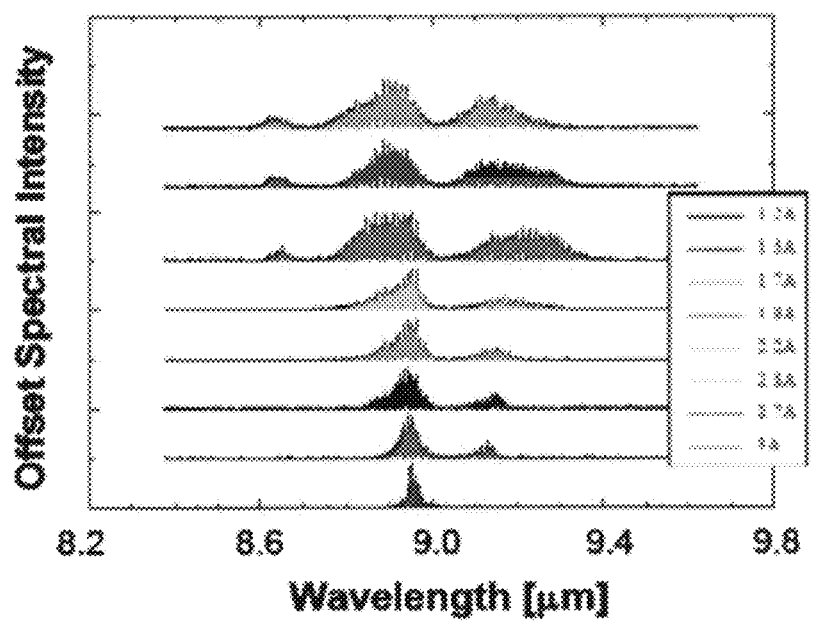
FIG. 6B is a graph of emission spectra of the Fabry-Perot laser for various drive currents.

According to one embodiment, the array 410 comprises a plurality of single-mode ridge lasers 510, illustrated schematically in FIG. 5A. In one example, discussed further below, the array 410 comprises 32 laser elements; however, it is to be appreciated that the array may comprise any number of DFB QCLs. In one example, the array 410 is capable of generating a comb of frequencies that span the gain bandwidth of the active region of the QCL material, and the frequency spacing between laser elements is sufficiently small that temperature tuning can be used to achieve continuous wavelength coverage, as illustrated in FIG. 5B. In FIG. 5B, the vertical lines 510 depict the laser frequencies and the curve 520 represents the gain bandwidth. In one example, the frequency of each DFB QCL varies linearly with position along the chip; however, it is to be appreciated that the invention is not so limited and the frequency variation may be non-linear with position of the elements in the array, as discussed further below. The array 410 has a width 520 and a depth 530. For a 32 element array, the width 520 may be approximately 3-5 mm and the depth 530 may be approximately 3-4 mm. In one example, the active regions of the QCL material comprise alternating layers of Gallium-Indium-Arsenide (GaInAs) and Aluminum-Indium-Arsenide (AlInAs) and include 35 cascades. The QCL material may be grown on a base substrate using metal-organic-vapor-phase epitaxy (MOVPE) or molecular beam epitaxy (MBE). The performance of Fabry-Perot lasers fabricated from this material is illustrated in FIGS. 6A and 6B. FIG. 6A illustrates the light-current-voltage (L-I-V) characteristics. At a heat sink temperature of 300 Kelvin (K), the peak output power under pulsed conditions is greater than 800 milliwatts (mW). At a heat sink temperature of 360 K the peak power drops to about 500 mW. The emission spectrum for various drive currents is illustrated in FIG. 6B. The emission spectrum spans the wavelength range of about 8.7 μm to 9.4 μm which roughly corresponds to the gain bandwidth of this particular QCL material.

Figure 7A:
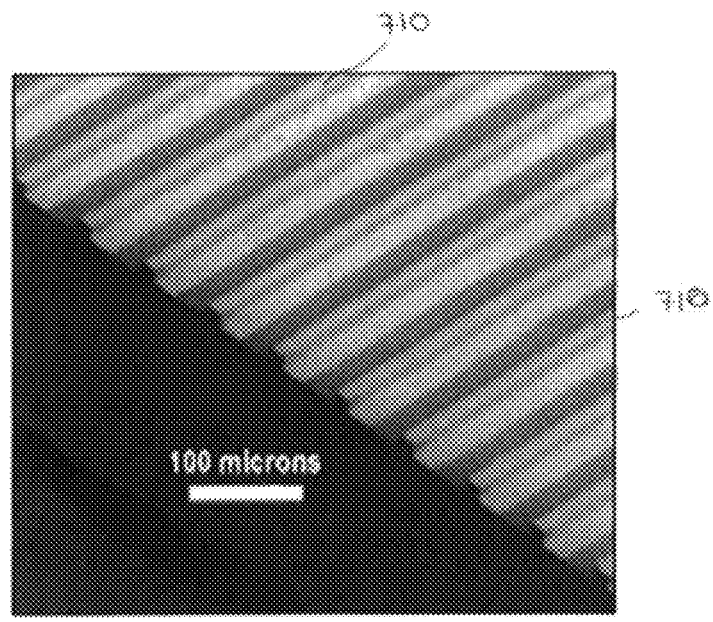
FIG. 7A is a photograph of a portion of a distributed feedback quantum cascade laser array according to aspects of the invention.
Figure 7B:
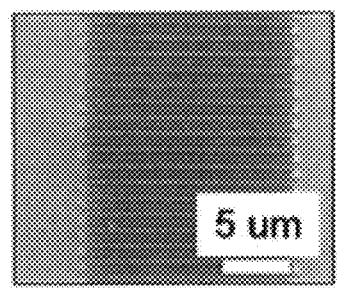
FIG. 7B is a photograph of a portion of one laser element of the array of FIG. 7A illustrating the distributed feedback grating.
Figure 8:
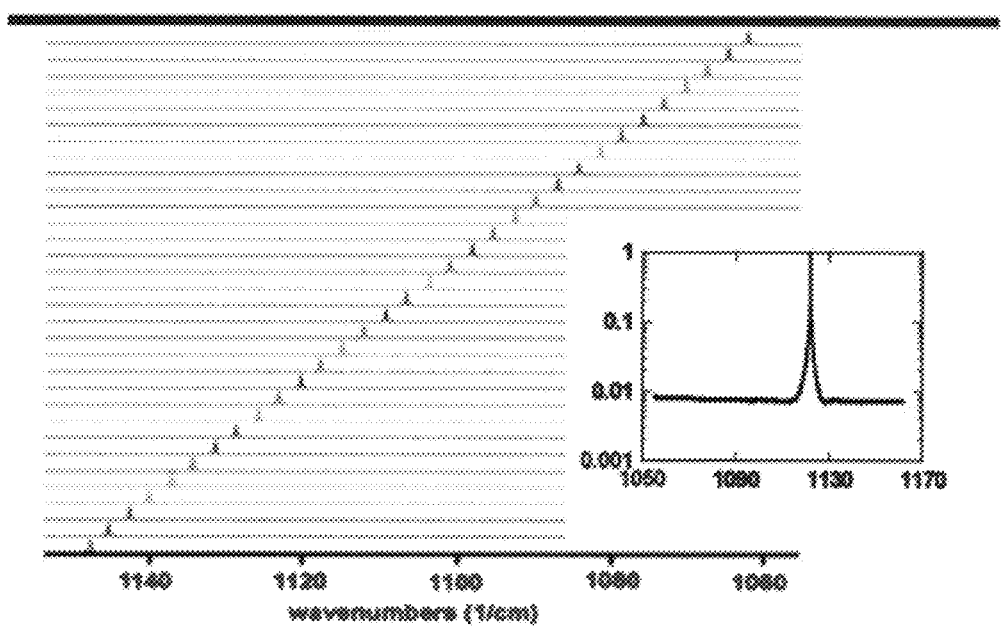
FIG. 8 is a plot of offset laser spectra for each of 32 lasers in a distributed feedback quantum cascade laser array according to aspects of the invention.

In one specific example (referred to herein as "Example 1"), the array 410 comprises 32 DFB QCL ridge laser elements emitting at frequencies from approximately 1061 to 1148 cm$^{-1}$ with the emission frequency of adjacent lasers separated by approximately 2.74 cm$^{-1}$. FIG. 7A illustrates a portion of the array. The laser ridges 710 are each 15 μm wide and separated by a center-to-center distance of 75 μm. The QCL active region for the array of Example 1 is a bound-to-continuum design for emission around about 9 μm, as described above, and the fabrication and performance of the array is discussed in U.S. patent application Ser. No. 11/611, 819 noted above. Each laser element includes a DFB grating, as shown in FIG. 7B. The grating period varies from laser to laser such that the emission wavelength varies from laser to laser. The spectra of all 32 lasers are illustrated in FIG. 8. As shown in FIG. 8, and as discussed above, the lasing frequencies span about 1060 cm$^{-1}$ to 1150 cm$^{-1}$, corresponding to a wavelength range of about 9.4 μm to 8.7 μm. The inset in FIG. 8 illustrates a typical spectrum on a logarithmic scale. The lasers are uniformly spaced in frequency with a precision of about $\frac{1}{10}^{th}$ of a wavenumber. The peak power from the laser elements varies within the array from about 20 to 300 mW when operating in a pulse mode with 50 nanosecond (ns) pulses at a repetition rate of 20 kilohertz (kHz). For the array of Example 1, the polarization of the output power 330 is perpendicular to the array dimension, as shown in FIG. 5A.

Referring again to FIG. 4, as discussed above, the transform lens 430 is placed one focal length from the array 410. In one example, for an optical system 400 including the array of Example 1, the transform lens 430 is a 2.5 centimeter (cm) diameter ZnSe (Zinc-Selenium) lens having a focal length of 2.5 cm. The lens position may be adjusted to vary slightly from exactly one focal length to ensure that the beams 440 are collimated and that the beams near the center of the array 410 propagate on-axis. The beam positions may be verified using a thermal infrared camera to image the beam spots, as discussed further below.

Still referring to FIG. 4, in one embodiment the grating 420 includes an Aluminum-coated reflection grating with a period of 75 lines/mm and a blaze wavelength of approximately 12 μm. The grating 420 may be attached to a rotation stage, allowing it to be rotated in a plane parallel to the laser array 410. As discussed above, the grating 420 is placed in the beam path approximately one focal length from the transform lens 430 so that the beams overlap at the grating. However, various practical/physical constraints in the optical system 400, for example, the size of the optical components and potentially a need to ensure that the beam path remains unobstructed, may influence the placement of the grating 420. As discussed above, in one embodiment it is desired that the beams 440 co-propagate after the grating 420. The angle at which the grating 420 should be placed relative to the array 410 or transform lens 430 such that the beams co-propagate may be deduced from the following grating equation:

$$d(\sin\theta_m + \sin\theta_n) = m\lambda_n \quad (2)$$

In Equation (2) d is the groove spacing of the grating 420, $\theta_m$ is the output angle of the m-th diffraction order, $\theta_n$ is the incident angle of the n-th laser beam on the grating, and $\lambda_n$ is the wavelength of that (n-th) laser. In one embodiment, the grating 420 is blazed for high efficiency in the first diffraction order and therefore m=1. The incident angles, $\theta_n$, of the laser elements in the array are all different and satisfy the following equation:

$$\theta_n = \theta_{grating} + \tan^{-1}\left(\frac{x_n}{f}\right) \quad (3)$$

In Equation (3) $x_n$ is the position of the n-th laser in the array and f is the focal length of the transform lens 430. For all the beams to co-propagate, all the lasers in the array must have the same output angle $\theta_m$ from the grating 420. In one example, using the example values of the wavelengths, laser spacing, grating, and transform lens given above, Equations (2) and (3) can be solved to yield a grating angle $\theta_{grating}$ of approximately 55 degrees.

Figure 9A:
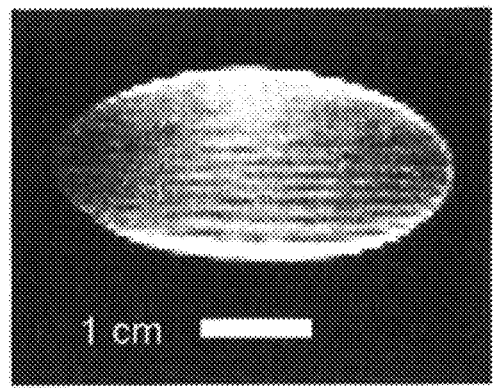
FIG. 9A is an image of a beam of a representative distributed feedback quantum cascade laser in the near-field of an optical wavelength beam combining system according to aspects of the invention.
Figure 9B:
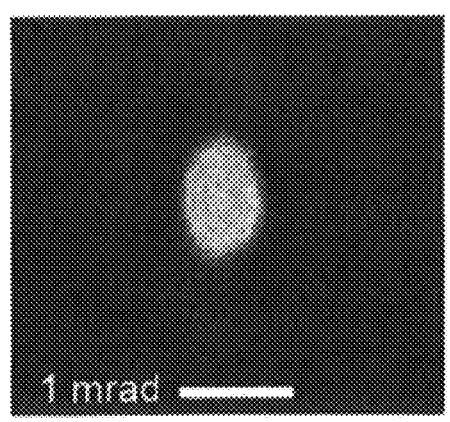
FIG. 9B is an image of the beam of the same representative distributed feedback quantum cascade laser in the far-field of the optical system according to aspects of the invention.

Referring to FIGS. 9A and 9B there are illustrated near-field (FIG. 9A) and far-field (FIG. 9B) intensity patterns for a representative single DFB QCL from the array 410 for an example of the optical system 400. In this example, the optical system includes the DFB QCL array of Example 1, a ZnSe transform lens having a diameter and focal length of 25 mm, and an Aluminum-coated reflection grating with a period of 75 lines/mm and a blaze wavelength of approximately 12 μm, the lens being one focal length from the front facet of the array and the grating being one focal length from the lens. This example optical system is referred to herein as Example 2. A thermal infrared (IR) camera was used to image the beams to obtain the patterns shown in FIGS. 9A and 9B. For the results presented below, the optical system of Example 2 was operated in a pulsed mode, for example, using 50 ns pulses at a rate of 10 kHz, and the DFB QCL elements in the array were turned on sequentially. However, it is to be appreciated that optical wavelength beam combining systems according to embodiments of the present invention are not limited to pulsed electrical operation and continuous wave operation of the DFB QCL elements in the array may be implemented. In addition, wavelength beam combining systems according to embodiments of the present invention are not limited in operation to firing/turning on one element at a time; several or all elements may be turned on at any given time.

As discussed above, the near-field of the optical system is measured at, or right after, the grating 420. To obtain the image shown in FIG. 9A, a flat mirror was placed in the beam path, just after the grating, to direct the beams to a convenient location for measurement. The IR camera was placed in the path of the laser beams and used to image the mirror surface to view the beam profile at the near-field location. The QCL emission has a large beam divergence which fills the 25 mm circular aperture of the ZnSe transform lens, and the beam is clipped by the edges of the lens because not all of the light can be collected by the lens in this example. The circular beam transmitted through the lens becomes elliptical after the grating because of the geometric magnification of the grating due to diffraction. In the illustrated example, the near-field has minor and major axes of about 2.5 cm and 3.5 cm respectively. In FIG. 9A, the white bar is 1 cm.

Figure 9C:
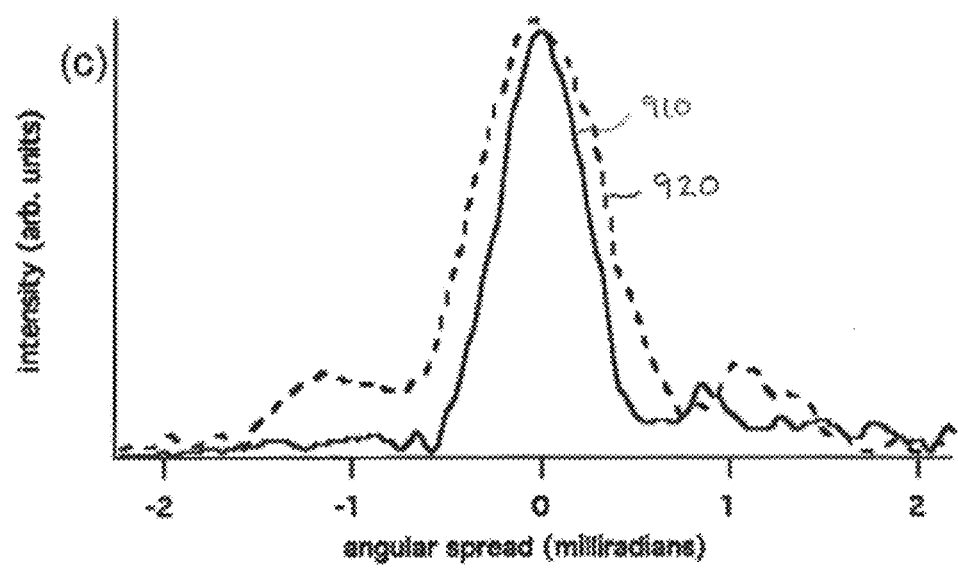
FIG. 9C is a linescan in the horizontal and vertical directions of the far-field image of FIG. 9B.

In order to image the far-field beam profile illustrated in FIG. 9B, a spherical mirror having a radius of curvature equal to 2.88 meters (m) was placed in the path of the beam in the optical system of Example 2. The spherical mirror was angled slightly so that the reflected beam could be focused onto the imaging plane of the IR camera (the camera's lens was removed) which was placed in the focal plane (f=1.44 m) of the mirror. By individually imaging all of the beams from the laser array 410, the spot size of the beams (in angular units) can be determined and the relative pointing between the beams in the far-field can be quantified. As illustrated in FIG. 9B, the far-field beam profile of a representative DFB QCL from the array has an Airy ring pattern and is also elliptical. Taking a linescan of the far-field beam profile illustrated in FIG. 9B, the angular extent of the main lobe of the Airy pattern, from null-to-null can be determined. The linescan corresponding to FIG. 9B is illustrated in FIG. 9C. In FIG. 9C, the solid trace 910 represents the linescan in the horizontal direction of the far-field image of FIG. 9B, and dotted trace 920 represents the linescan in the vertical direction of the far-field image of FIG. 9B. For the illustrated example, the angular extent is 0.93 milliradians in the horizontal direction and 1.3 milliradians in the vertical direction. The white bar in FIG. 9B is 1 milliradian. For comparison, the diffraction-limited spot size for a collimated beam is given by:

$$\theta \approx \frac{2.44\lambda}{D} \quad (4)$$

From Equation (4), the diffraction-limited spot size at 9-μm wavelength for a beam collimated with a 2.5 cm diameter lens is calculated to be 0.86 milliradians. The beam divergence of an individual laser in the optical system of Example 2 is therefore approximately 1.5 times the diffraction-limit in both dimensions.

Figure 10:
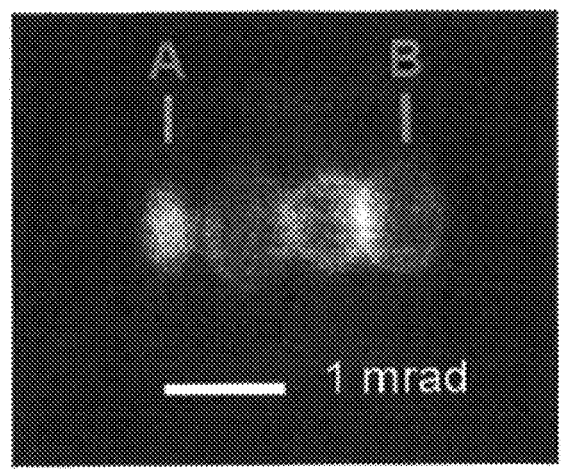
FIG. 10 is an image of the beam spots in the far-field of several laser elements in an optical wavelength beam combining system according to aspects of the invention.
Figure 11:
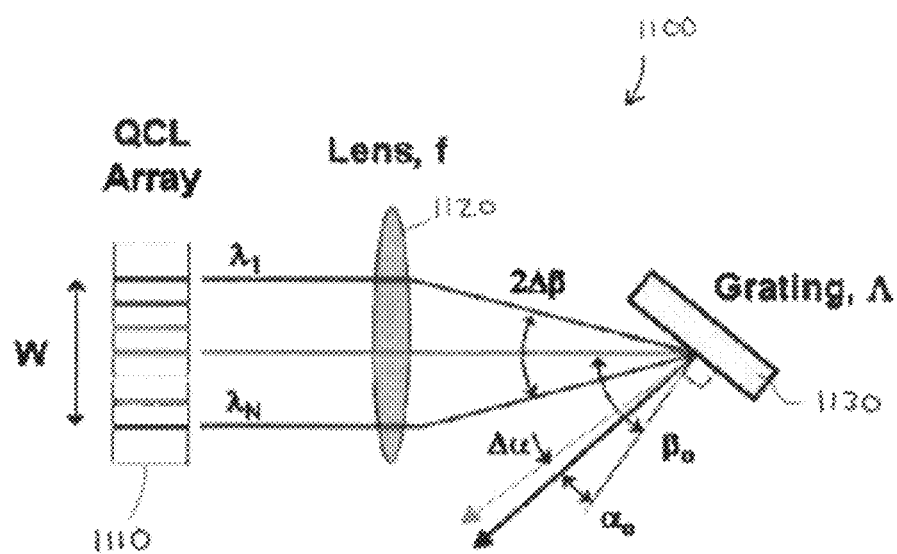
FIG. 11 is a schematic diagram of one example of a wavelength beam combining system according to aspects of the invention.

According to one embodiment, the overlap of the beams from the lasers in the array 410 in the far-field can be determined by individually imaging all the beams and overlaying those images to measure any shifts in beam pointing. Referring to FIG. 10 there is illustrated a composite image of the far-field beam spots from four different DFB QCL elements in the array 410 of the optical system of Example 2. As can be seen with reference to FIG. 10, all of the beam spots lie on the same horizontal line. The center-to-center distance between the beam spots corresponds to a difference in beam pointing. In FIG. 10, the white bar is 1 milliradian. Referring to FIG. 11, there is illustrated a schematic diagram of one example of an optical wavelength beam combining system 1100 comprising an array 1110 of n lasers, a transform lens 1120 have a focal length f, and a grating 1130 having a period A. In one embodiment, the system 1100 is configured t overlap the beams from the two end lasers (emitting at wavelengths $\lambda_1$ and $\lambda_n$) at a far-field position A. The center laser then has a relative pointing error indicated by far-field position B. The largest measured difference in beam pointing for any two lasers in the array of the optical system of Example 2 (from A to B) was approximately 2 milliradians, which is approximately equal to about 7 times the diffraction-limited far-field spot size for a single laser.

Figure 12:
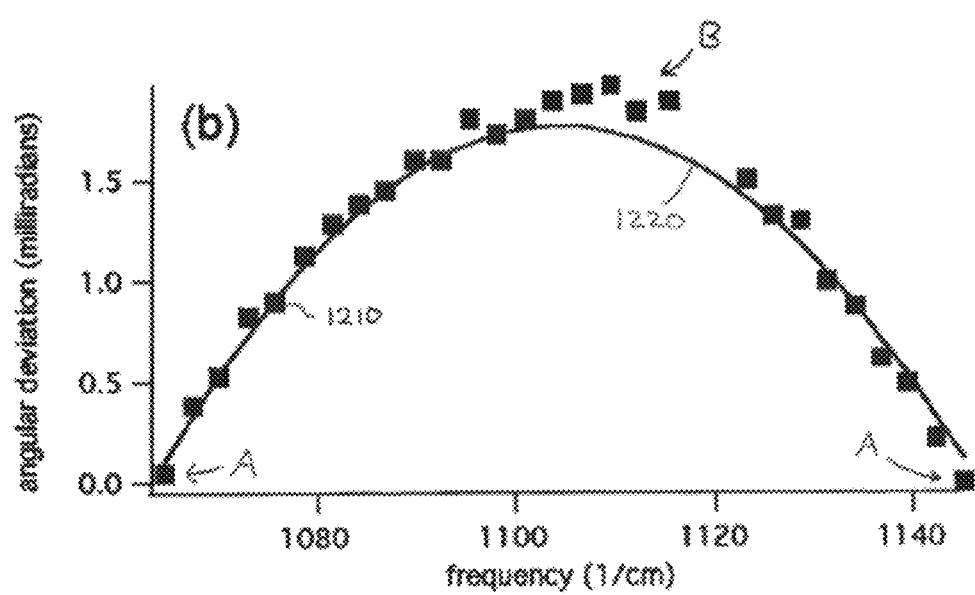
FIG. 12 is a plot of the angular deviation of the laser beams from one example of a distributed feedback quantum cascade laser array in an optical wavelength beam combining system according to aspects of the invention.

FIG. 12 plots the angular deviation of the laser beams from the entire array (from the optical system of Example 2) as a function of laser frequency. In the illustrated example, the squares represent the pointing error of laser beams measured along the beam-combining dimension relative to the laser corresponding to $\lambda_{n-1}$ (which is laser 31 in the 32 element array). FIG. 12 compares the experimental results (represented by the squares 1210) to a calculation (represented by line 1220) of the pointing error using the grating equation, Equation (2), above, with inputs to Equation (2) being the wavelengths of the DFB QCL array and a grating angle of 54.65 degrees. As can be seen with reference to FIG. 12 there is good agreement between the experimental results and the calculation.

As discussed above, for the optical system of Example 2, a worst-case residual pointing error was observed to be about 2 milliradians (mrad). Defining the beam-quality product of the laser array as the product of the near-field beam size and the far-field divergence, a beam-quality product of (3.5 cm)(2 mrad+0.93 mrad)=103 mm mrad for the beam-combined system of Example 2. For reference, using the null-to-null definition of far-field divergence, a diffraction-limited beam has a beam-quality product of 22 mm mrad. For the laser array of Example 1, without beam combining, the far-field divergence would have been 86 mrad, about 40 times larger, and the beam-quality product would have been (2.5 cm)(86 mrad+ 0.93 mrad)=2173 mm mrad, about 21 times larger. Thus, the wavelength beam combining according to aspects of the invention provides a significant improvement.

It has been determined that the residual pointing error, or the lack of perfect overlap of the emission from all lasers, exists because the dispersion of the external grating is a non-linear function of laser frequency, whereas in the array of the optical system of Example 2, the laser frequency varies linearly across the semiconductor chip. Therefore, in one embodiment, the pointing error may be reduced by using a laser array in which either the spacing of frequencies in the array or the physical spacing of the laser elements in the array, or a combination of both, is non-linear. For example, the spatial distribution and/or the wavelengths of the DFB QCL elements in the array 410 may be selected to match the dispersion of the grating 420. In particular, the desired spacing of the laser frequencies or the laser element positions may be calculated using Equation (2).

Figure 13:
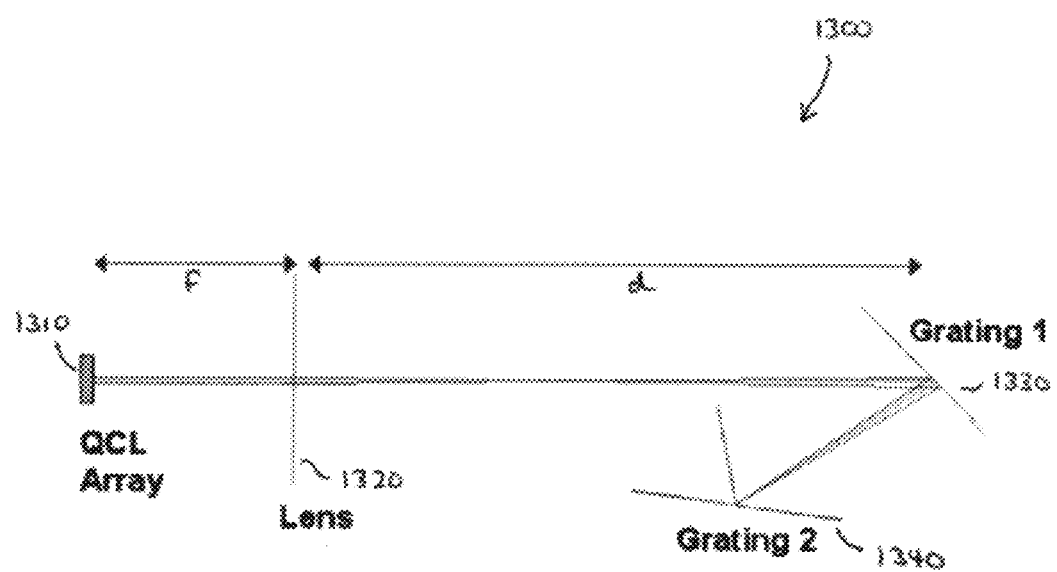
FIG. 13 is a schematic diagram of one example of a wavelength beam combining system using two gratings according to aspects of the invention.

According to another embodiment, the pointing error may be reduced through the choice of diffraction grating and transform lens. For example, a second grating may be used to compensate for the non-linear dispersion due to a single grating. Referring to FIG. 13 there is illustrated an example of a wavelength beam combining system 1300 including a DFB QCL array 1310, a transform lens 1320 that collimates the emission from the array 1310, a first diffraction grating 1330 and a second diffraction grating 1340. As discussed above, the transform lens 1320 is placed one focal length, f, from the DFB QCL array 1310. In one embodiment, the first grating 1330 is oriented such that it provides greater dispersion than is required to overlap the beams from the lasers at ether end of the array 1310. The second grating 1340 then imparts a dispersion of opposite sign to optimally overlap al of the laser beams. By using gratings with two different groove densities, the non-linear component of the dispersion can be greatly reduced or nearly cancelled. In order to overlap the laser beams at the second grating 1340, the placement of the first grating 1330 is flexible. The first grating 1330 may be placed more than one focal length from the transform lens 1330 (distance d in FIG. 13) and the distance between the two gratings may be adjusted to overlap the beams. In one example, placing the first grating 1330 far away from the transform lens 1320 allows more clearance for the beam to propagate through the system 1300 without clipping.

The pointing error was calculated for an example of the system 1300, summarized in Table 1 below. In this example, the system 1300 includes a 32 element DFB QCL array configured to emit across the wavelength range 8.7 µm-9.4 µm, such as, the array of Example 1. The transform lens 1320 has a focal length of 10 cm, and the first grating 1330 was placed a distance d=30 cm from the lens. The first grating 1330 has groove density of 100 lines/mm and an orientation angle of 28 degrees relative to the transform lens 1320. The second grating 1340 has a groove density of 50 lines/mm and an orientation angle of 16 degrees. For this example, the pointing error is calculated to be only 0.5 microradians, which is about 4000 times less than the above-discussed example using a single grating with 75 lines/mm Reduction in the pointing error may allow for far greater range in remote sensing applications, as discussed further below.

TABLE 1

| | |
|---|---|
| Array (Example 1) | 8.7-9.4 µm |
| Focal length | 10 cm |
| Grating 1 | 100 lines/mm; 28° |
| Grating 2 | 50 lines/mm; 16° |
| Geometric magnification | 2.0 |
| Pointing error | 500 nrad |
| Pointing error/Divergence | 0.001 |

Active pointing error correction may also be performed, for example, by mounting the external grating 420 on a rotating mount, or by inserting additional optical elements, such as a rotatable mirror or MEMS tiltable mirror array, into the beam path.

Figure 14:
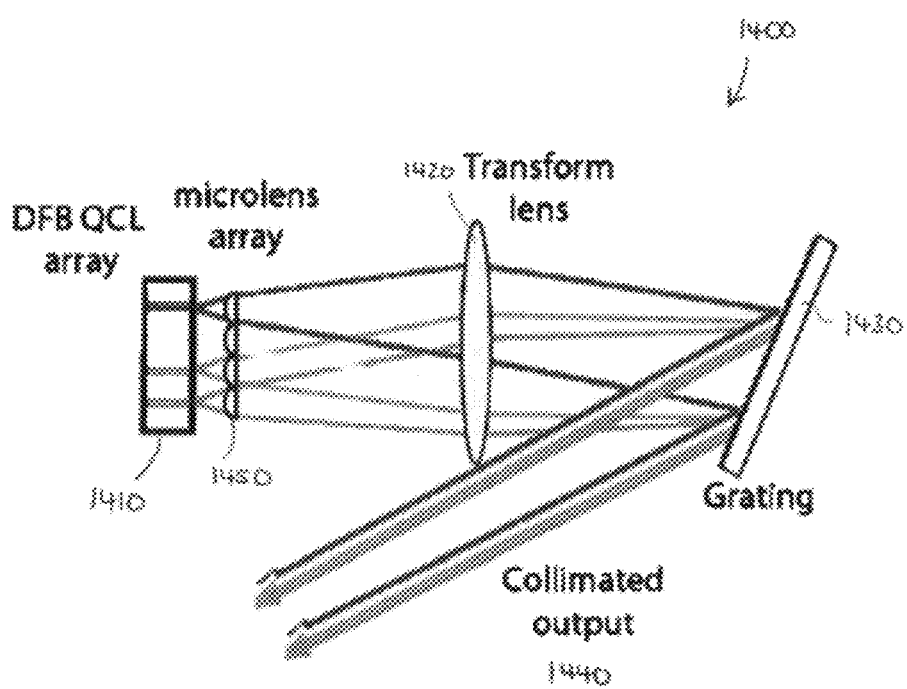
FIG. 14 is a schematic diagram of another example of a wavelength beam combining system using a microlens array according to aspects of the invention.

According to one embodiment, the above-discussed improvement in the beam-quality product achieved using wavelength beam combining is dependent on the fill factor of the array 410. In one example, a spherical microlens array may be used to increase the effective mode size for each laser in the array and achieve a near-unity fill factor. Referring to FIG. 14, there is illustrated an example of a wavelength beam combining system using a microlens array according to one embodiment. The system 1400 includes a DFB QCL array 1410, a transform lens 1420 and a grating 1430, as discussed above, and produces a collimated output beam 1440. A spherical microlens array 1450 is placed between the laser array 1410 and the transform lens 1420. In one example, the microlens array 1450 increases the effective mode size for each laser in the array 1410 by a factor of about 5. In this example, wavelength beam combining using the system 1400 may improve the beam-quality factor by a factor of about 12.

For the beam combining system of Example 2, discussed above, the grating efficiency, defined as the ratio of the power in the first-order diffracted beam to the incident laser power, was measured to be approximately 55%. For the weakest laser in the system of Example 2 with an output power of 20 mW, this grating efficiency translates to 11 mW of power coupled to the far-field beam, neglecting atmospheric absorption. For the strongest lasers in the array, the power coupled to the far-field may be up to about 140 mW. Based on efficiency curves of current commercially available blazed gratings, a diffraction efficiency of greater than 90% may be achieved with careful selection of the grating and polarization of the incident laser beams. Generally, blazed gratings are more efficient for p-polarized light (electric field is perpendicular to the grating grooves), whereas QCLs are TM polarized (s-polarized at the grating in a wavelength beam combining configuration such as that shown in FIG. 4). Therefore, according to one embodiment a polarization control element, for example, a half-wave plate, is used to alter the polarization of the laser beams and access a higher diffraction efficiency of the external grating.

Figure 15:
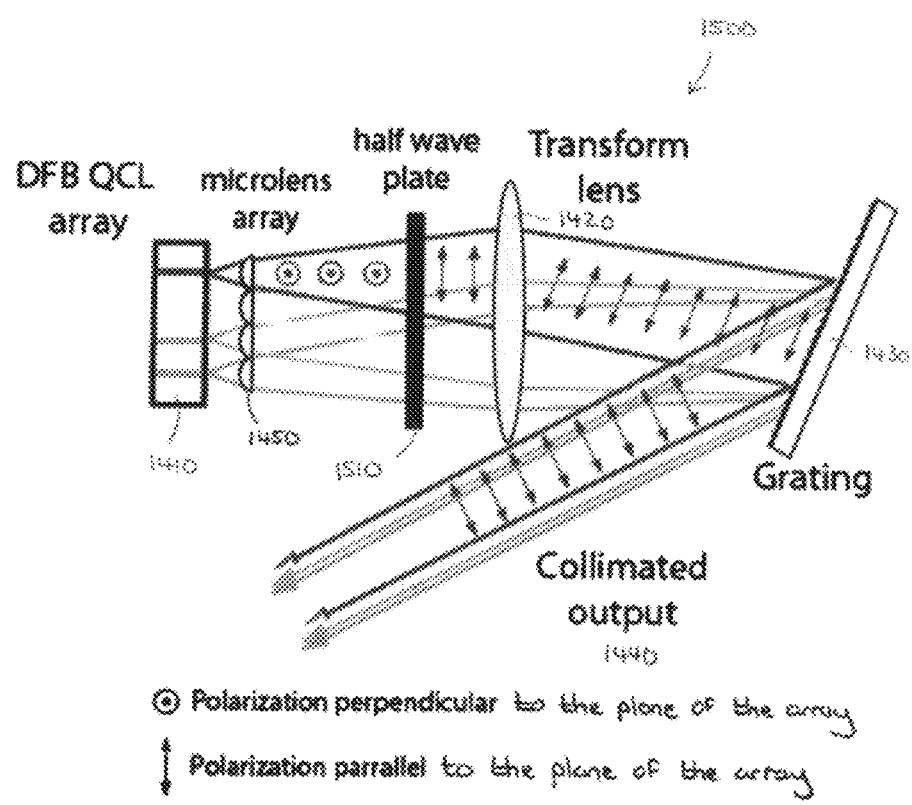
FIG. 15 is a schematic diagram of another example of a wavelength beam combining system using a polarization control element according to aspects of the invention.

Referring to FIG. 15 there is illustrated an example of a wavelength beam combining system 1500 including a half-wave plate 1510. In the illustrated example the system 1500 includes a microlens array 1450 as discussed above; however, it is to be appreciated that the half-wave plate 1510 may be used in a system with or without a microlens array. The half-wave plate 1510 rotates the polarization of the incident light by 90 degrees. Thus, as shown in FIG. 15, incident light that is polarized perpendicular to the plane of the array 1410 has its polarization rotated by the half-wave plate 1510 such that the light transmitted by the half-wave plate is polarized parallel to the plane of the array. In the illustrated example the half-wave plate 1510 is located between the array 1410 and the transform lens 1420. However, the half-wave plate 1510 may alternatively be placed between the transform lens 1420 and the grating 1430 since the purpose of the half-wave plate is to rotate the polarization of the light prior to incidence on the grating to maximize the grating efficiency.

According to another embodiment, the laser beams may be steered by temperature tuning to change the emission wavelengths of at least some of the laser elements in the array 410. This tuning may be achieved, for example, by changing the temperature of a heatsink on which the laser array is mounted, by applying DC current in each element (desired to be tuned) in the array, or by using heating elements fabricated monolithically with the array. The change in frequency results in a shift in the diffracted angle of the laser beam. As a result, the ability to tune the emission wavelengths leads to a slight change in pointing angle (direction of the beam after the grating 420). Wavelength tuning may therefore be used, for example, to fine-tune or correct the pointing angle for each (or at least some) element in the laser array and ensure long distance co-propagation of the output beam. In one example, using an embodiment of the system of Example 2 and a thermoelectric (Peltier) device to heat/cool the laser submount, varying the temperature from 293 K to 332 K, the temperature tuning of the lasers was measured to be about $-0.073$ cm$^{-1}$/K. For one selected laser, this temperature change corresponded to an emission frequency change from 1112.3 cm$^{-1}$ to 1109.5 cm$^{-1}$, resulting in an angular shift of the beam of 1.8 milliradians. The calculated angular shift using Equation (2) is 1.7 milliradians.

The ability to tune the emission wavelength of each element in the laser array may have advantages for spectroscopic and sensing applications, for example, in which narrow absorption features play a key role. For various (short distance) applications, the slight change in pointing angle resulting from the change in emission wavelength is generally acceptable. In addition, for certain applications, the ability to steer the output beam may be of interest. For example, as discussed above, temperature tuning or current tuning of the output frequency of individual laser elements or of the array as a whole may be used to provide "electrical" (as opposed to mechanical, for example, using a rotating grating or mirror) beam steering. In some embodiments, it may be preferable to ensure that the dispersion of the external grating 420 and the dispersion resulting from the spatial distribution of the elements in the laser array do not match, for example, where it is desirable to maximize the range of accessible angles.

Figure 16:
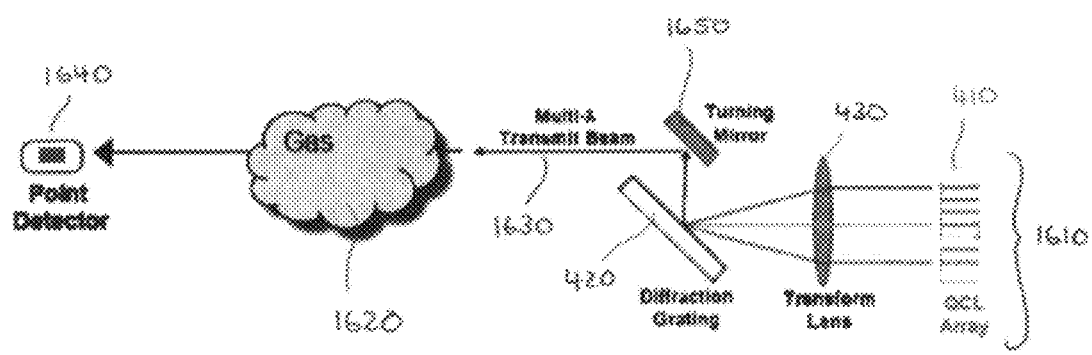
FIG. 16 is a schematic diagram of one example of a wavelength beam combining system employed in a remote sensing application, according to aspects of the invention.

According to one embodiment, a wavelength beam combining system according to aspects of the invention can be used for remote sensing applications. Referring to FIG. 16, there is illustrated a diagram of one example of a wavelength beam combining system employed in a remote sensing application, according to one embodiment. As discussed above, the wavelength beam combining system 1610 comprises a DFB QCL array 410, a transform lens 430 and a grating 420, and may also include any of the optional additional optical elements discussed above. The transmission spectrum of, for example a gas cloud 1620 may be obtained by directing the multi-wavelength transmit beam 1630 from the wavelength beam combining system 1600 through the cloud and measuring the transmitted signal with a point detector 1640. As discussed above, wavelength beam combining overlaps the beams from the lasers in the array in the far-field, allowing the measurements to be made with a single point detector 1640. In one example, as discussed further below, the transmission spectrum is obtained by sequentially firing the lasers in the array 410 and measuring the transmitted signal; however, in other examples the several or all laser elements may be turned on at any given time. A turning mirror 1650 may be used to appropriately direct the output beam toward the point detector 1640. In this manner, the transmission spectrum can be measured without the need for an FTIR spectrometer.

Figure 17:
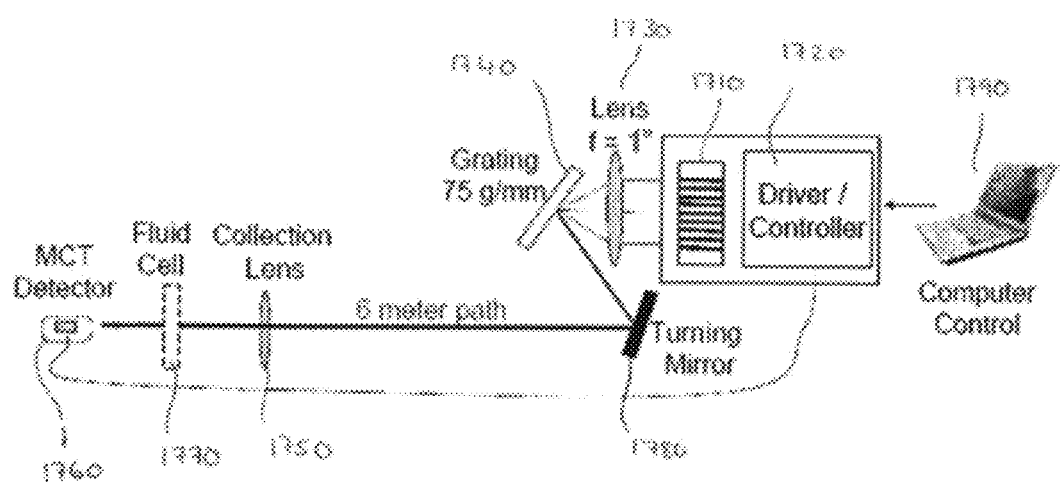
FIG. 17 is a schematic diagram of an example of a system including a wavelength beam combined distributed feedback quantum cascade laser array used for a remote sensing measurement example in accordance with aspects of the invention.

The following non-limiting example demonstrates the use of an optical wavelength beam combining system employing a DFB QCL array, such as the system of Example 2, in remote sensing applications. It is to be appreciated however that numerous different embodiments of the wavelength beam combining systems discussed herein can be used for a variety of applications, including, for example, target or scene illumination, countermeasures, and chemical and biological spectroscopic applications such as, for example, remote spectroscopic sensing, high resolution spectroscopy, pollution monitoring, breath analysis, industrial process control, and remote detection of toxic chemicals and/or explosives. FIG. 17 is a schematic diagram showing the system configuration used for the following example demonstration of a wavelength beam combined DFB QCL array for remote sensing. This example included an absorption-spectroscopy measurement at a distance of 6 m from the laser array. The system used for this example included the above-described system of Example 2, including the DFB QCL laser array 1710 with an integrated controller 1720 (as described above), transform lens 1730 having a focal length of 2.5 cm, and grating 1740 having a groove density of 75 lines/mm. At a distance of 6 m, a BaF$_2$ collection lens 1750 (having a focal length of 19 cm and a diameter of 5 cm) was placed in front of a thermoelectrically-cooled fast HgCdTe MCT detector 1760 (model PCI-3TE-12 1x1 from Vigo) to collect the laser light from the array 1710 onto the detector 1760. A BaF$_2$ fluid cell 1770 was placed in the path of the beams between the collection lens 1750 and the detector 1760. The fluid cell 1770 was filled with isopropyl alcohol for sample measurement or left empty to measure the background. A turning mirror 1780 was used to direct the beams toward the detector 1760, and the system was operated under the control of a computer 1790.

Figure 18:
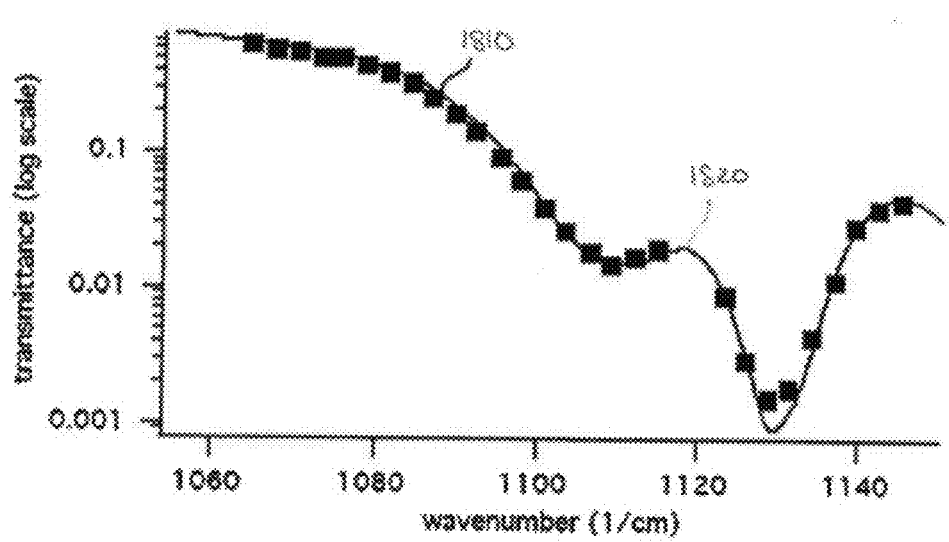
FIG. 18 is an illustration of an absorption spectrum of isopropanol measured using an embodiment of the system of FIG. 17 according to aspects of the invention.

To measure the spectrum of the isopropyl alcohol sample, the lasers in the array 1710 were fired sequentially and the intensities of the transmitted beams were recovered from the detector 1760 using a gated integrator (not shown). After taking the background and sample spectra, the absorption spectrum of the sample was obtained using a frequency table with data for each laser in the array 1710. The absorption spectrum is illustrated in FIG. 18, in which the squares 1810 represent the measured data from the above-described system 1700 and solid line 1820 represents a Fourier-transform infrared-spectrometer measurement of the same sample taken using a Bruker VERTEX 80v FTIR instrument. As can be seen with reference to FIG. 18, there is good agreement between the two measurements. Without wavelength beam combining it would not be feasible to measure the absorption spectrum using a DFB QCL array since the laser beams would be separated by as much as 0.5 m at a range of 6 m. Using the wavelength beam combining system, the spectra took less than ten seconds to acquire, and with an improved controller and detection electronics, the measurement time may be reduced to milliseconds or less. This is significantly faster than is currently possible with single-element external-cavity QCLs which presently typically require approximately one second to scan over the full wavelength range.

According to aspects and embodiments of the present invention, wavelength beam combining is used to combine the beams from a plurality of laser elements of a DFB QCL array, allowing the array to be used for a variety of applications, as discussed above. Although some of the above-discussed examples refer to arrays with relatively few elements, for example, 32 elements, the principles of the invention may be applied to arrays comprising many elements, for example hundreds or even thousands of laser elements, limited only by the practical spacing of the array elements and the physical size of the array. As discussed above, various techniques can be applied to improve the overlap of the beams in the far-field, thereby allowing the arrays to be used for remote sensing (and other) applications over large distances, for example up to or exceeding one kilometer.

Figure 19A:
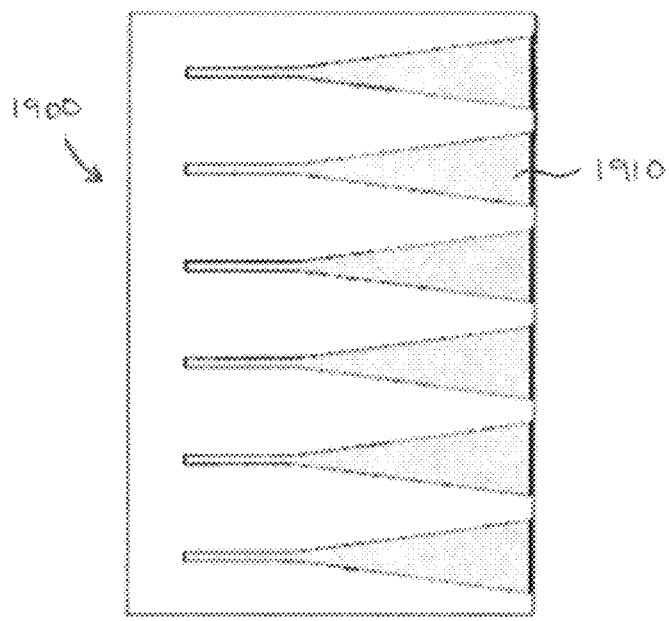
FIG. 19A is a schematic diagram of one example of an array of master-oscillator quantum cascade lasers according to aspects of the invention.
Figure 19B:
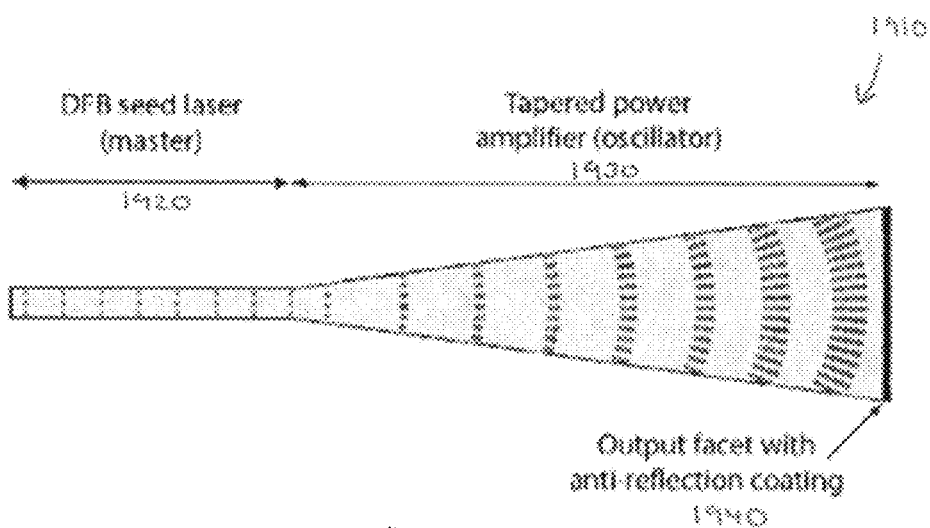
FIG. 19B is a diagram of one example of a master-oscillator quantum cascade laser element used in the array of FIG. 19A.

According to one embodiment, to improve the power level of each (or at least some) laser elements in the array, wavelength beam combining may be applied to the output of a monolithic array of master-oscillator (MOPA) QCLs instead of an array of DFB QCLs. FIG. 19A schematically illustrates an array 1900 of MOPA QCLs 1910 that may replace, in some examples, the DFB QCL array discussed in above. FIG. 19B illustrates schematically an example of a single MOPA QCL element 1910 in the array 1900. The MOPA QCL 1910 comprises a DFB seed laser 1920 (the master) coupled to a tapered power amplifier 1930 (the oscillator). The MPOA QCL element 1910 has an output facet with an anti-reflection coating 1940.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. For example, although the above-discussed examples refer to wavelength beam combining of first order, edge-emitting DFB QCL arrays, aspects and embodiments may also be used to beam combine edge- and surface-emitting DFB QCL arrays in which the DFB gratings are higher order DFB gratings. Furthermore, the invention is not limited to arrays of regularly positioned elements (in terms of the spatial distribution of the elements), or to elements with an emission spectrum separated by a small and regular wavelength difference. There are many variations of the configuration of the DFB QCL arrays (or MOPA QCL arrays) that may be used. For example, one embodiment may use arrays of Fabry-Perot QCLs in which the external grating 420, in addition to acting as a beam combining element, provides feedback to the Fabry-Perot elements to enable lasing. In one example of such an embodiment, the emission wavelength of each Fabry-Perot element is also selected by the external grating 420. In addition, although the above-discussed examples refer to open-loop wavelength beam combining, other embodiments may use closed-loop wavelength beam combining, which may provide benefits in terms of beam overlap and simplified device fabrication. Accordingly, the foregoing description and drawings are by way of example only.

What is claimed is:

1. A laser source comprising:
    a multi-wavelength quantum cascade laser (QCL) array including a plurality of single mode distributed feedback (DFB) QCL elements each having a corresponding DFB grating and each configured to emit a laser beam having a different emission wavelength, the emission wavelength of each DFB element being determined at least in part by a grating period of the corresponding DFB grating;
    a dispersive element external to the QCL array and configured to spatially overlap the laser beams from the plurality of DFB QCL elements in the far-field of the laser source to provide a single combined output beam, wherein the dispersive element does not substantially contribute to lasing and selection of the emission wavelength of the plurality of DFB QCL elements; and
    transform optics positioned between the QCL array and the dispersive element and configured to overlap the laser beams in the near-field of the laser source and to direct the laser beams from the QCL array onto the dispersive element, the transform optics being further configured to transform a spatial position of each DFB QCL element in the QCL array into a corresponding angle of incidence of each corresponding laser beam on the dispersive element, the angles of incidence being different;
    wherein the angles of incidence of the laser beams on the dispersive element and the emission wavelengths of the plurality of DFB QCL elements are selected to substantially match the angular dispersion of the dispersive element such that the dispersive element is configured to combine the laser beams into the single combined output beam, and
    wherein the dispersive element is positioned approximately one focal length from the transform optics.

2. The laser source of claim 1, wherein the dispersive element is a diffraction grating.

3. The laser source of claim 1, wherein at least one DFB QCL element of the QCL array includes a monolithically integrated QCL amplifier section.

4. The laser source of claim 1, wherein a combination of spatial spacing and emission wavelength spacing between each of the plurality of DFB QCL elements of the QCL array is selected to compensate for nonlinearity of the angular dispersion of the dispersive element to provide the single combined output beam from the laser source.

5. The laser source of claim 1, wherein a spatial spacing between the plurality of DFB QCL, elements of the QCL array is selected to compensate for pointing error due to a mismatch between an emission wavelength of the DFB QCL elements in the QCL array and any nonlinearity of the dispersive element.

6. The laser source of claim 1, wherein a wavelength spacing between the plurality of DFB QCL elements of the QCL array is selected to compensate for pointing error due to a mismatch between a position of the plurality of DFB QCL elements in the array and any nonlinearity of the dispersive element.

7. The laser source of claim 1, further comprising:
    a heat sink coupled to the QCL array; and
    a controller configured to alter at least one of a temperature of the heat sink and a temperature of at least one of the DFB QCL elements to tune an emission wavelength of the at least one DFB QCL element to correct pointing error of the laser beam emitted by the at least one DFB QCL element.

8. The laser source of claim 1, further comprising:
a heat sink coupled to the QCL array; and
a controller configured to alter at least one of a temperature of the heat sink and a temperature of least one of the DFB elements to tune an emission wavelength of the at least one DFB QCL element to control a pointing direction of the laser beam emitted by the at least one DFB QCL element.

9. The laser source of claim 1, wherein the DFB grating of at least one of the DFB QCL elements is a DFB grating of at least a second order.

10. The laser source of claim 1, wherein at least one DFB QCL element of the QCL array includes an anti-reflection coating covering the output facet of the at least one DFB QCL element.

11. The laser source of claim 1, wherein at least one DFB QCL element of the QCL array is operated in a pulsed mode.

12. The laser source of claim 1, wherein at least one DFB QCL element of the QCL array is operated in a continuous wave mode.

13. The laser source of claim wherein at least two DFB QCL elements of the QCL array are operated simultaneously.

14. The laser source of claim 1, wherein at least two DFB QCL elements of the QCL array are turned on sequentially.

15. The laser source of claim 1, further comprising:
a microlens array positioned between the QCL array and the transform optics.

16. The laser source of claim 1, further comprising:
a half-wave plate positioned between the QCL array and the dispersive , the half-wave plate being configured to rotate a polarization of the laser beams.

17. The laser source of claim 1, wherein the dispersive element is a first dispersive element, and further comprising:
a second dispersive element optically coupled to the first dispersive element and configured to improve overlap in the far-field of the laser source.

18. The laser source of claim 1, wherein the dispersive element is a prism.

19. The laser source of claim 1, wherein the transform optics are positioned approximately one focal length from an output facet of the DFB QCL elements of the QCL array.

* * * * *